United States Patent [19]
Kondo

[11] Patent Number: 5,725,994
[45] Date of Patent: Mar. 10, 1998

[54] NEGATIVE TYPE PHOTOSENSITIVE COMPOSITIONS COMPRISING A HYDROXYIMIDE COMPOUND

[75] Inventor: Syunichi Kondo, Shizuoka, Japan

[73] Assignee: Fuji Photo Film Co., Ltd., Minami-ashigara, Japan

[21] Appl. No.: 657,193

[22] Filed: Jun. 3, 1996

[30] Foreign Application Priority Data

Jun. 14, 1995 [JP] Japan ................................. 7-147626
Aug. 10, 1995 [JP] Japan ................................. 7-204743

[51] Int. Cl.$^6$ ................................................ G03F 7/004
[52] U.S. Cl. ..................... 430/270.1; 430/302; 430/325; 430/330
[58] Field of Search ..................... 430/270.1, 302, 430/325, 330

[56] References Cited

U.S. PATENT DOCUMENTS

| | | | |
|---|---|---|---|
| 4,845,009 | 7/1989 | Kita et al. | 430/270.1 |
| 4,851,454 | 7/1989 | White et al. | 430/270.1 |
| 5,059,513 | 10/1991 | Hopf et al. | 430/330 |
| 5,272,042 | 12/1993 | Allen et al. | 430/270.1 |
| 5,420,331 | 5/1995 | Ueda et al. | 430/270.1 |
| 5,585,218 | 12/1996 | Nakano et al. | 430/325 |

*Primary Examiner*—John S. Chu
*Attorney, Agent, or Firm*—Burns, Doane, Swecker & Mathis, LLP

[57] ABSTRACT

Disclosed are a novel photosensitive composition which can form a sharp negative image, a photosensitive composition recordable independently of the emission wavelength of an exposure light source, and particularly, a photosensitive composition recordable in a region from near infrared to infrared (heat rays), a method for producing a novel image recording material which can form a sharp negative image, and a heat mode write type lithographic printing plate for direct plate-making which can directly record digital data of a computer, etc. by use of a solid state laser and a semiconductor laser (heat mode) having an emission region from near infrared to infrared, utilizing a conventional processing device or printing device as it is. The photosensitive composition comprises an acid precursor, a specified hydroxyimide compound, and a hydroxyl group-containing linear polymer.

7 Claims, No Drawings

NEGATIVE TYPE PHOTOSENSITIVE COMPOSITIONS COMPRISING A HYDROXYIMIDE COMPOUND

FIELD OF THE INVENTION

The present invention relates to photosensitive compositions which can be used as offset printing masters and give sharp negative images, and to methods for producing image recording materials. In particular, the present invention is directed to photosensitive compositions which can form excellent resist patterns in producing lithographic printing plates, proof prints of multicolor printing, drawings for overhead projectors, and further integrated circuits of semiconductor elements, and to method for producing image recording materials.

BACKGROUND OF THE INVENTION

Previously, many image forming methods utilizing various photo-curing materials have been known, and have been used in various fields such as printing plates, print circuits, coatings, ink, hologram recording and three-dimensional modeling.

Examples of such methods include a method of forming a coating of a photo-curing material on a support, subjecting the material to image exposure for a desired image to cure an exposed portion, and removing an unexposed portion by dissolution, thereby forming a cured relief image; a method of providing the above-mentioned photopolymerizable layer between two supports at least one of which is transparent, subjecting the layer to image exposure from the side of the transparent support to induce a change in adhesive strength due to light, and then, stripping the support, thereby forming an image; a method of preparing a photographic material having a microcapsule layer containing a photo-curing composition and a color material such as a leuco dye as contents, subjecting the photographic material to image exposure to photo-cure capsules of an exposed portion, destroying capsules of an unexposed portion by pressurizing treatment or heating treatment, and bringing the contents into contact with a developer for the color material to develop color, thereby forming a colored image; an image formation method utilizing a change in toner adhesion of a photo-curing composition due to light; and an image formation method utilizing a change in refractive index of a photo-curing composition due to light.

As photo-curing materials used for such image formation, many materials are disclosed to the public. Typical examples thereof include crosslinking materials using bichromates, etc., photodimerization type crosslinking materials such as vinyl cinnamate, azido group pendant type crosslinking materials, crosslinking materials according to bisazido, photodimerization type crosslinking materials of dimethylmaleimide, radical polymerizable monomers, radical photopolymerizable materials mainly composed of radical photoinitiators, cationic polymerizable monomers, cationic photopolymerizable materials mainly composed of photo-acid generators, photo-crosslinking materials comprising photo-acid generators and resins containing epoxy groups, etc., and diazo curing materials comprising diazo resins and binders. They may be appropriately used alone or in combination, depending on their application and purpose.

In any case, the latitude of processing at the time of use and the latitude of use circumstances is widened as the difference in properties between before exposure and after exposure is enlarged, resulting in easy practical use.

For example, if the solubility of an exposed portion in a developing solution (such as an aqueous alkali solution) is largely different from that of an unexposed portion, an image obtained in development is a little affected by a change in concentration of the developing solution or the temperature of the developing solution. As a result, sharp and constant image quality can be easily obtained.

The conventional photo-curing materials which have been put to practical use are largely changed in properties by light, and further by treatment such as heating if necessary. Novel materials having such properties have been desired to be further developed.

In recent years, the development of lasers is remarkable, and particularly, high-output, small-sized solid state lasers and semiconductor lasers having an emission region from near infrared to infrared become easily available. These lasers are very useful as exposure light sources used in direct plate-making from digital data of computers, etc.

Previously, as lithographic printing plates which can directly form images from digital data of computers, there are known printing plates utilizing an electrophotographic system, photopolymerization printing plates in which exposure by use of an argon laser or a YAG laser and further after heating as required are combined, printing plates comprising photosensitive resins and silver salt photographic materials laminated thereon, printing plates of a silver salt diffusion transfer system, and printing plates in which silicone rubber layers are destroyed by electrical discharges or laser beams.

The printing plates using an electrophotographic system are complicated in electrification, exposure and development processing, and devices become complicated and large-scaled. The photopolymerization printing plates inherently have limitations on sensitivity, make it difficult to use small-sized lasers, and are difficult to be treated in a bright room. The printing plates laminated with silver salt photographic materials and the printing plates of a silver salt diffusion transfer system have the disadvantage that processing is complicated, resulting in increased cost. Further, the printing plates in which silicone rubber layers are destroyed by electrical discharges or laser beams have the problem that silicone scum remaining on surfaces of the plates can not be sufficiently removed.

As a technique in which images can be formed using these light sources, JP-A-52-113219 (the term "JP-A" as used herein means an "unexamined published Japanese patent application") discloses a positive type recording material comprising a compound decomposed by light and heat (for example, a diazonium compound), grains of a material which can absorb light and convert it to heat, and a binder. Further, JP-A-58-148792 discloses a positive type photosensitive, heat-sensitive recording material mainly composed of grains of a thermoplastic resin, a light-heat converting substance and a photocrosslinking substance (for example, a diazonium compound).

However, the recording materials to which the above-mentioned lasers can be used as light sources are low in sensitivity. Further, in the case of direct plate-making, digital data of computers, etc. is directly written in plate materials by scanning of laser beams, so that the above-mentioned positive type materials require a considerable period of write time. Accordingly, the development of high-sensitive materials (negative type if possible) to which solid state lasers and semiconductor lasers (heat mode) having an emission region from near infrared to infrared and capable of shortening write time can be used has been desired.

Thus, such conventional lithographic printing plates which can directly form images from digital data of computers are not sufficiently satisfactory.

On the other hand, there are methods for producing various image recording materials using the novel materials as described above. In these production methods, it is required that excellent properties of these novel materials are sufficiently exhibited to obtain excellent images.

SUMMARY OF THE INVENTION

An object of the present invention is to provide a novel photosensitive composition which can form a sharp negative image.

Another object of the present invention is to provide a photosensitive composition recordable independently of the emission wavelength of an exposure light source, and particularly, a photosensitive composition recordable in a region from near infrared to infrared (heat rays).

A further object of the present invention is to provide a method for producing a novel image recording material which can form a sharp negative image.

A still further object of the present invention is to provide a heat mode write type lithographic printing plate for direct plate-making which can directly record digital data of a computer, etc. by use of a solid state laser and a semiconductor laser (heat mode) having an emission region from near infrared to infrared, utilizing a conventional processing device or printing device as it is.

The present inventor has searched various negative type photosensitive materials, in order to attain the above-mentioned objects, and have discovered that a hydroxyl group-containing linear polymer is efficiently crosslinked with a hydroxyimide compound represented by formula (I) in the presence of an acid.

Further, the present inventor has discovered the fact that a coating obtained by mixing a radiation-absorbing substance (for example, a dispersion of carbon black) with a solution of a photosensitive composition comprising a hydroxyl group-containing linear polymer, an acid precursor and a hydroxyimide compound, applying the resulting mixture to a support, and drying it is heat crosslinked by irradiation with YAG laser beams to become insoluble in a solvent or an aqueous alkali solution, thus completing the present invention.

According to the present invention, there are provided (1) A negative type photosensitive composition comprising an acid precursor, a compound represented by the following general formula (I) and a hydroxyl group-containing linear polymer:

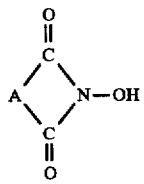

wherein A represents a divalent substituted or unsubstituted aliphatic residue, or a divalent substituted or unsubstituted aromatic residue;

(2) The composition described in the above (1), wherein said composition further comprises a radiation-absorbing substance; and (3) A method for producing an image recording material comprising subjecting the composition described in the above (1) to image exposure, followed by heat treatment and further development.

Preferred embodiments of the present invention include the following (4) to (10):

(4) A heat mode write type lithographic printing plate for direct plate-making comprising a support and a negative type photosensitive composition layer formed thereon comprising a substance absorbing infrared light or near infrared light and generating heat, an acid precursor, a hydroxyl group-containing linear polymer and a compound represented by general formula (I);

(5) The printing plate of the above (4), wherein the substance absorbing infrared light or near infrared light and generating heat is a dye;

(6) The printing plate of the above (4), wherein the substance absorbing infrared light or near infrared light and generating heat is a pigment;

(7) The printing plate of the above (4), wherein the substance absorbing infrared light or near infrared light and generating heat is carbon black;

(8) The printing plate of the above (4), wherein the support is a polyester film;

(9) The printing plate of the above (4), wherein the support is an aluminum plate; and

(10) A method for recording a negative type image comprising exposing a photosensitive lithographic printing plate by use of a laser emitting near infrared light or infrared light, and then, developing the printing plate with an aqueous alkali solution, said printing plate comprising a support and a negative type photosensitive composition layer formed thereon comprising a substance absorbing infrared light or near infrared light and generating heat, an acid precursor, a hydroxyl group-containing linear polymer and a compound represented by general formula (I).

In the present invention, the hydroxyl group-containing linear polymer is heat crosslinked with the compound represented by general formula (I) by exposure, heating treatment and developing treatment in the presence of an acid produced from the acid precursor to prepare an excellent negative image.

Further, in the present invention, the light energy obtained by exposure is converted to the heat energy, and the hydroxyl group-containing linear polymer is heat crosslinked with the compound represented by general formula (I) by the heat energy generated in the presence of an acid produced from the acid precursor to prepare an excellent negative image.

When the radiation is infrared light or near infrared light, recording in the heat mode can be preferably improved.

In the present invention, when the substance absorbing infrared light or near infrared light and generating heat is the dye, development after exposure is preferably improved, and when the substance is the pigment, sensitivity is preferably improved. Further when the substance is the carbon black, wide absorption wavelength region and high sensitivity can be obtained.

In the present invention, use of the polyester film as the support preferably results in formation of a lightweight support and a light-transmitting image, and use of the aluminum plate results in excellent dimensional stability and durability.

The photosensitive composition of the present invention is preferably exposed by use of a laser emitting near infrared light or infrared light, and then, developed with an aqueous alkali solution.

Further, when the photosensitive composition of the present invention is used for producing a photosensitive lithographic printing plate, it is preferably the heat mode write type lithographic printing plate for direct plate-making.

The term "heat mode write" means recording on the photosensitive composition by controlling an appropriate heat ray source based on digital data. The heat ray source used in this case is a thermal head used in a facsimile, a thermal copying machine or the like, or a laser emitting infrared light or near infrared light. For direct plate-making, the laser emitting infrared light or near infrared light is preferably used.

In the present invention, near infrared light or infrared light is preferably used. Infrared light is generally called heat rays. When the recording of the present invention is performed with infrared light, the present invention is also said to be heat-sensitive.

DETAILED DESCRIPTION OF THE INVENTION

The present invention will hereinafter be illustrated in detail.

The hydroxyimide compounds represented by general formula (I) used in the present invention are described below.

In general formula (I), A represents a divalent substituted or unsubstituted aliphatic residue or a divalent substituted or unsubstituted aromatic residue.

In general formula (I), the divalent aliphatic residue represented by A is a straight chain, branched chain and/or cyclic residue having a saturated and/or unsaturated bond and preferably 2 to 20 carbon atoms. Examples of such residues include ethylene, triethylene, propylene, ethylethylene, 1,1-dimethylethylene, 1-ethyl-1-methylethylene, 1,2-dimethyl-ethylene, tetramethylethylene, dodecylethylene, octadecyl-ethylene, 2-methyltrimethylene, 2-ethyltrimethylene, 1,1-dimethyltrimethylene, 2,2-dimethyltrimethylene, 2-ethyl-2-methyltrimethylene, 1-ethyl-3-methyltrimethylene, 1,2-cyclobutylene, 1,2-cyclohexylene, 1,2,2-trimethyl-1,3-cyclopentylene, 2,3-norbornylene, vinylene, methylvinylene, 1,1-dimethylvinylene, methyleneethylene, nonenylethylene, dodecynylethylene, octadodecenylethylene, 1-cyclohexene-1,2-ylene, 4-cyclohexene-1,2-ylene, 5-methyl-4-cyclohexene-1,2-ylene, 4,5,6-trimethyl-4-cyclohexene-1,2-ylene, 5-norbornene-2,3-ylene and bicyclo[2.2.2]octo-5-ene-2,3-ylene.

The divalent substituted aliphatic residues represented by A include the divalent aliphatic residues as described above having aryl groups such as phenyl as substituent groups, having ether linkages formed with oxygen atoms in structure, or having halogen groups such as chloro as substituent groups. Examples thereof include 1-methyl-1-phenylethylene, 1-benzyl-1-methylethylene, 1-phenylethylene, 1,1-diphenylethylene, 1-phenyltrimethylene, 2-phenyltrimethylene, 1-ethyl-1-phenyltrimethylene, phenylvinylene, 3,6-oxo-1,2,3,6-tetrahydrophthalyl, 1,4,5,6,7,7-hexachloro-5-norbornene-2,3-ylene.

The divalent aromatic residues represented by A include arylene groups and heterocyclic aromatic residues, and are preferably monocyclic or bicyclic. Examples thereof include O-phenylene, 1,2-naphthylene, 1,8-naphthylene, 2,3-pyridinediyl, 2,3-pyrazinediyl and 2,3-benzo[b]thiophenediyl.

Further, the divalent substituted aromatic residues represented by A include the divalent aromatic residues as described above having lower alkyl groups such as methyl, halogen groups such as chloro and bromo, nitro groups or acetamino groups as substituent groups. Examples thereof include 3-methyl-1,2-phenylene, 4-methyl-1,2-phenylene, 3-chloro-1,2-phenylene, 4-chloro-1,2-phenylene, 3-bromo-1,2-phenylene, 3,6-dichloro-1,2-phenylene, 3,6-dibromo-1,2-phenylene, 3,4,5,6-tetrachloro-1,2-phenylene, 3,4,5,6-tetrabromo-1,2-phenylene, 3-nitro-1,2-phenylene, 3-acetamino-1,2-phenylene, 4-chloro-1,8-naphthylene, 4-bromo-1,8-naphthylene, 4,5-dibromo-1,8-naphthylene, 4-bromo-5-chloro-1,8-naphthylene, 4-nitro-1,8-naphthylene, 5-methyl-2,3-benzo[b]-thiophenediyl, 5-chloro-2,3-benzo[b]-thiophenediyl, and 1-ethyl-2,3-indolediyl.

The hydroxyimide compounds represented by the above-mentioned general formula (I) used in the present invention are synthesized according to methods described in G. F. Jaubert, *Berichte der Deutschen Chemischen Gesellschaft*, 28, 360–364 (1895), D. E. Ames et al., *Journal of the Chemical Society*, 3518–3521 (1955), M. A. Stolberg et al., *Journal of the Chemical Society*, 79, 2615–2617 (1957), L. Bauer et al., *Journal of Organic Chemistry*, 24, 1293–1296 (1959) and L. M. Werbel et al., *Journal of Medical Chemistry*, 10, 32–36 (1967).

Examples of the hydroxyimide compounds used in the present invention are enumerated below, but the present invention is not limited thereto.

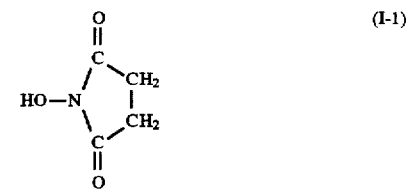

(I-1)

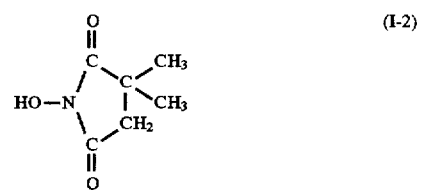

(I-2)

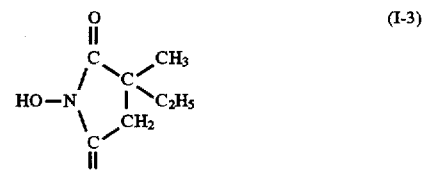

(I-3)

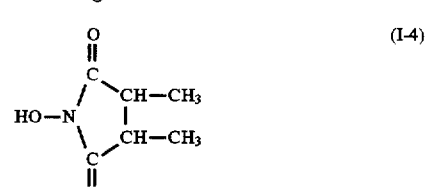

(I-4)

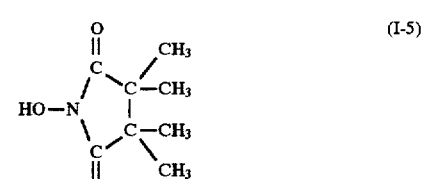

(I-5)

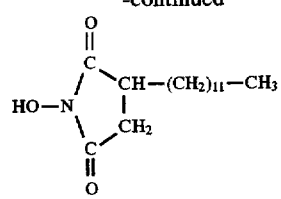 (I-6)
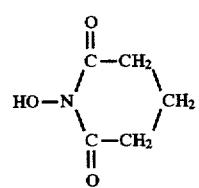 (I-7)
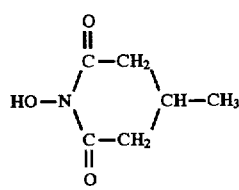 (I-8)
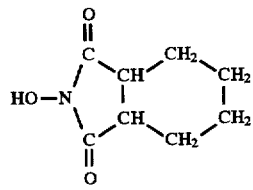 (I-9)
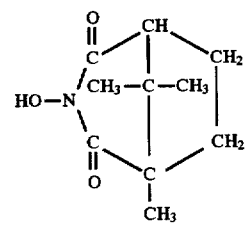 (I-10)
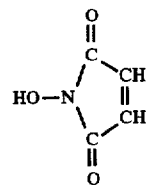 (I-11)
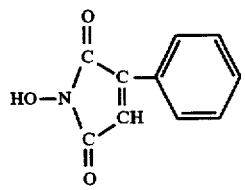 (I-12)
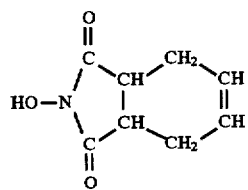 (I-13)
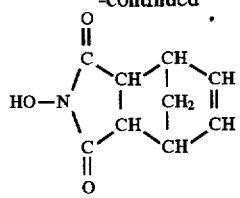 (I-14)
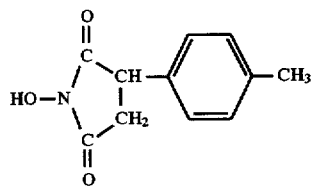 (I-15)
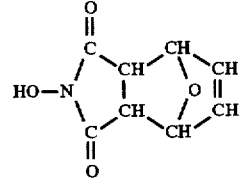 (I-16)
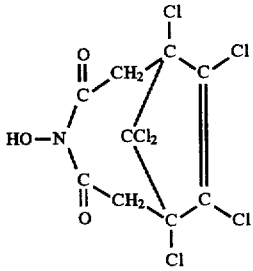 (I-17)
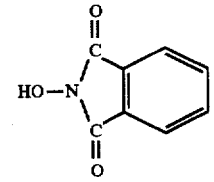 (I-18)
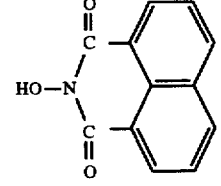 (I-19)
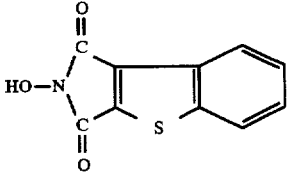 (I-20)
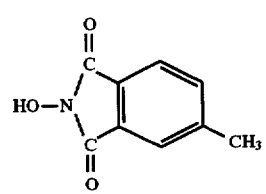 (I-21)

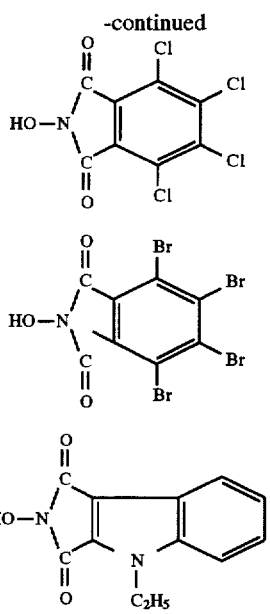

(I-22)

(I-23)

(I-24)

These compounds represented by the above-mentioned general formula (I) are added usually in an amount of 0.1 to 50% by weight based on total solids contained in the photosensitive composition, preferably in an amount of 1 to 40% by weight, and more preferably in an amount of 5 to 30% by weight.

The acid precursors used in the present invention are described below.

The acid precursors which can be used in the present invention include photoinitiators for cationic photopolymerization, photoinitiators for radical photopolymerization, photodecoloring agents for dyes, photodiscoloring agents, known acid generating agents used in micro resists, known compounds generating acids by heat decomposition and mixtures thereof. They can be appropriately selected for use.

Examples thereof include onium salts such as diazonium salts described in S. I. Schlesinger, Photogr. Sci. Eng., 18, 387 (1974) and T. S. Bal et al., Polymer, 21, 423 (1980), ammonium salts described in U.S. Pat. Nos. 4,069,055, 4,069,056 and Re 27,992, and JP-A-4-365049, phosphonium salts described in D. C. Necker et al., Macromolecules, 37, 2468 (1984), C. S. Wen et al., Teh, Proc. Conf. Rad. Curing ASIA, p. 478, Tokyo, Oct. 1988, U.S. Pat. Nos. 4,069,055 and 4,069,056, iodonium salts described in J. V. Crivello et al., Macromolecules, 10 (6), 1307 (1977), Chem. & Eng. News, Nov. 28, p. 31 (1988), European Patent 104,143, U.S. Pat. Nos. 339,049 and 410,201, JP-A-2-150848 and JP-A-2-296514, sulfonium salts described in J. V. Crivello et al., Polymer, J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 390,214, 233,567, 297,443 and 297,442, U.S. Pat. Nos. 4,933,377, 161,811, 410,201, 339, 049, 4,760,013, 4,734,444 and 2,833,827, German Patents 2,904,626, 3,604,580 and 3,604,581, selenonium salts described in J. V. Crivello et al., Macromolecules, 10 (6), 1307 (1977) and J. V. Crivello et al., J. Polymer Sci., Polymer Chem. Ed., 17, 1047 (1979), and arsonium salts described in C. S. Wen et al., Teh, Proc. Conf. Rad. Curing ASIA, p. 478, Tokyo, Oct. (1988); organic halogen compounds described in U.S. Patent 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metals/organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896) and JP-A-2-161445; photo-acid generators having o-nitrobenzyl protective groups described in S. Hayase et al., J. Polymer Sci., 25, 753 (1987), E. Reichmanis et al., J. Polymer Sci. Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc. 3571 (1965), P. M. Collins et al., J. Chem. Soc., Perkin I, 1695 (1975), M. Rudinstein et al., Tetrahedron Lett., (17) 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0,290, 750, 046,083, 156,535, 271,851 and 0,388,343, U.S. Pat. Nos. 3,901,710 and 4,181,531, JP-A-60-198538 and JP-A-53-133022; compounds generating sulfonic acid by photodecomposition represented by iminosulfonates described in M. Tunooka et al., Polymer Preprints Japan, 38 (8), G. Berner et al., J. Rad. Curing, 13 (4), W. J. Mijs et al., Coating Technol., 55 (697), 45 (1983), Akzo, H. Adachi et al., Polymer Preprints Japan, 37 (3), European Patents 0,199,672, 84,515, 199,672, 044,115 and 0,101,122, U.S. Pat. Nos. 4,618,564, 4,371,605 and 4,431,774, JP-A-64-18143, JP-A-2-245756 and JP-A-4-365048; and disulfone compounds described in JP-A-61-166544.

Further, compounds into main chains or side chains of which these acid-generating groups or compounds are introduced can also be used. Examples of such compounds are described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146037, JP-A-63-163452, JP-A-62-153853 and JP-A-63-146029.

Furthermore, compounds generating acids by light can also be used which are described in V. N. R. Pillai, Synthesis, (1), 1 (1980), A. Abad et al., Tetrahedron Lett., (47), 4555 (1971), D. H. R. Barton et al., J. Chem. Soc., (C), 329 (1970), U.S. Pat. No. 3,779,778 and European Patent 126, 712.

Of these acid precursors, ones particularly effectively used are described below.

(1) Oxazole derivatives represented by the following general formula (VIII), which are substituted by trihalomethyl groups, or S-triazine derivatives represented by the following general formula (IX), which are substituted by trihalomethyl groups

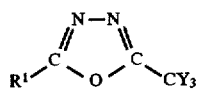 (VIII)

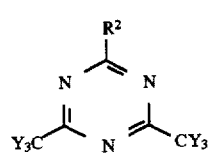 (IX)

wherein $R^1$ represents a substituted or unsubstituted aryl or alkenyl group, $R^2$ represents a substituted or unsubstituted aryl, alkenyl or alkyl group, or $-CY_3$, and Y represents a chlorine atom or a bromine atom.

Specific examples of the above-mentioned oxazole derivatives (VIII) and S-triazine derivatives (IX) include but are not limited to compounds VIII-1 to VIII-8 and compounds IX-1 to IX-10 shown below:

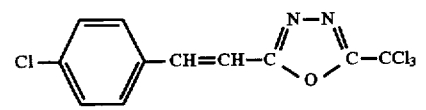 (VIII-1)

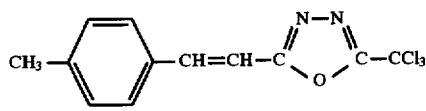 (VIII-2)

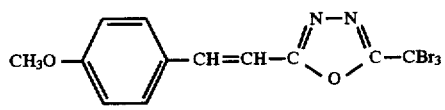 (VIII-3)

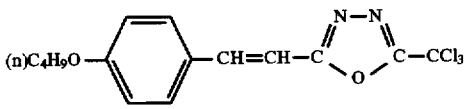 (VIII-4)

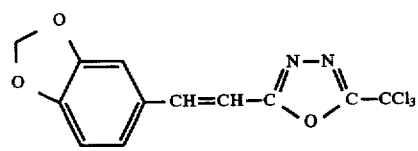 (VIII-5)

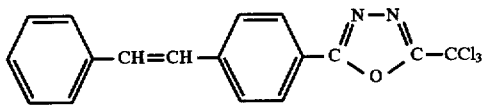 (VIII-6)

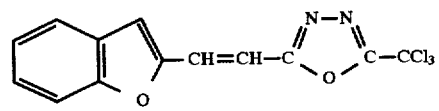 (VIII-7)

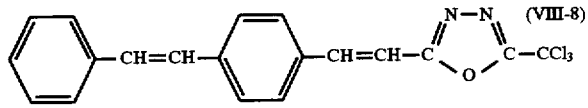 (VIII-8)

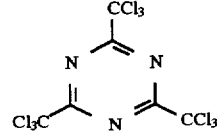 (IX-1)

-continued

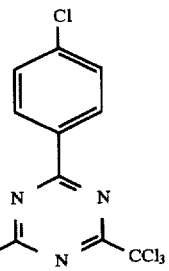 (IX-2)

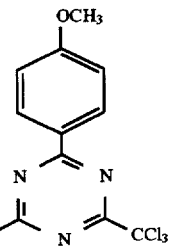 (IX-3)

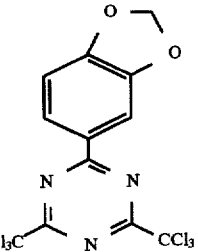 (IX-4)

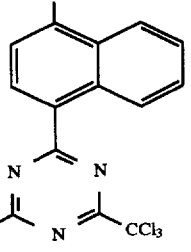 (IX-5)

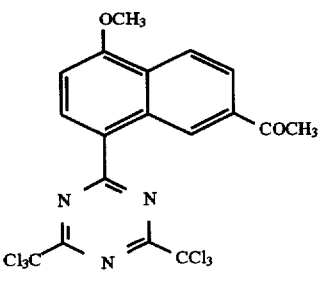 (IX-6)

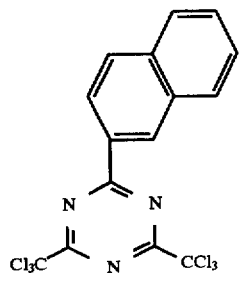 (IX-7)

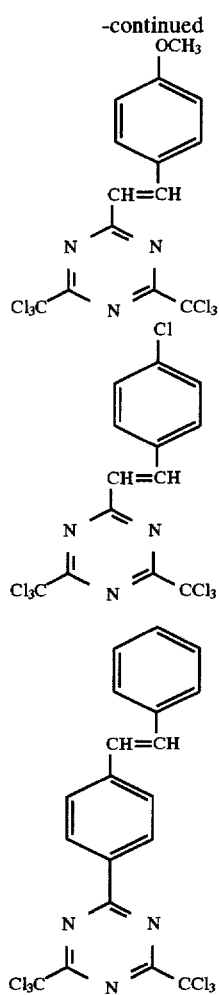

(2) Iodonium salts represented by the following general formula (X) or sulfonium salts represented by the following general formula (XI):

$$\begin{array}{c}Ar^1\\ \phantom{Ar^1}\diagdown\\ \phantom{Ar^1}\phantom{\diagdown}I^+Z^-\\ \phantom{Ar^1}\diagup\\ Ar^2\end{array} \quad (X)$$

$$\begin{array}{c}R^3\\ \phantom{R^3}\diagdown\\ R^4{-}S^+Z^-\\ \phantom{R^3}\diagup\\ R^5\end{array} \quad (XI)$$

$Ar^1$ and $Ar^2$ each independently represents a substituted or unsubstituted aryl group. Preferred examples of substituent groups include alkyl, haloalkyl, cycloalkyl, aryl, alkoxyl, nitro, carboxyl, alkoxycarbonyl, hydroxyl, mercapto and halogen.

$R^3$, $R^4$ and $R^5$ each independently represents a substituted or unsubstituted alkyl or aryl group, which is preferably an aryl group having 6 to 14 carbon atoms, an alkyl group having 1 to 8 carbon atoms or a substituted derivative thereof. Preferred examples of substituent groups to the aryl groups include alkoxyl having 1 to 8 carbon atoms, alkyl having 1 to 8 carbon atoms, nitro, carboxyl, hydroxyl and halogen, and preferred examples of substituent groups to the alkyl groups include alkoxyl having 1 to 8 carbon atoms, carboxyl and alkoxy-carbonyl.

$Z^-$ represents a counter anion. Examples thereof include but are not limited to $BF_4^-$, $AsF_6^-$, $PF_6^-$; $SbF_6^-$, $SiF_6^-$, $ClO_4^-$, $CF_3SO_3^-$, $BPh_4^-$ (Ph=phenyl), condensed polynuclear aromatic sulfonic acid anions such as a naphthalene-1-sulfonic acid anion, anthraquinonesulfonic acid anions and sulfonic acid group-containing dyes.

Two of $R^3$, $R^4$ and $R^5$, and $Ar^1$ and $Ar^2$ may each combine with each other through a single bond or a substituent group.

The onium salts represented by general formulas (X) and (XI) are known in the art, and can be synthesized, for example, by methods described in J. W. Knapczyk et al., *J. Am. Chem. Soc.*, .91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331.

Specific examples of the onium salts represented by general formulas (X) and (XI) include but are not limited to compounds X-1 to X-22 and compounds XI-1 to XI-34 shown below:

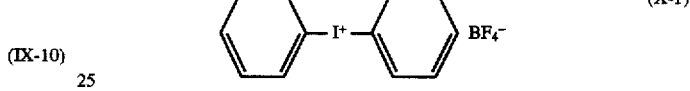

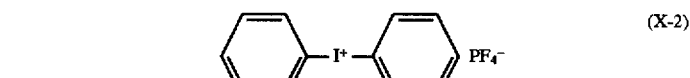

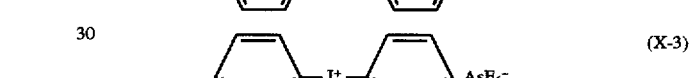

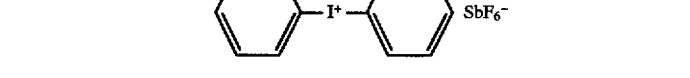

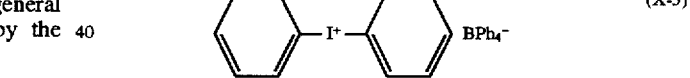

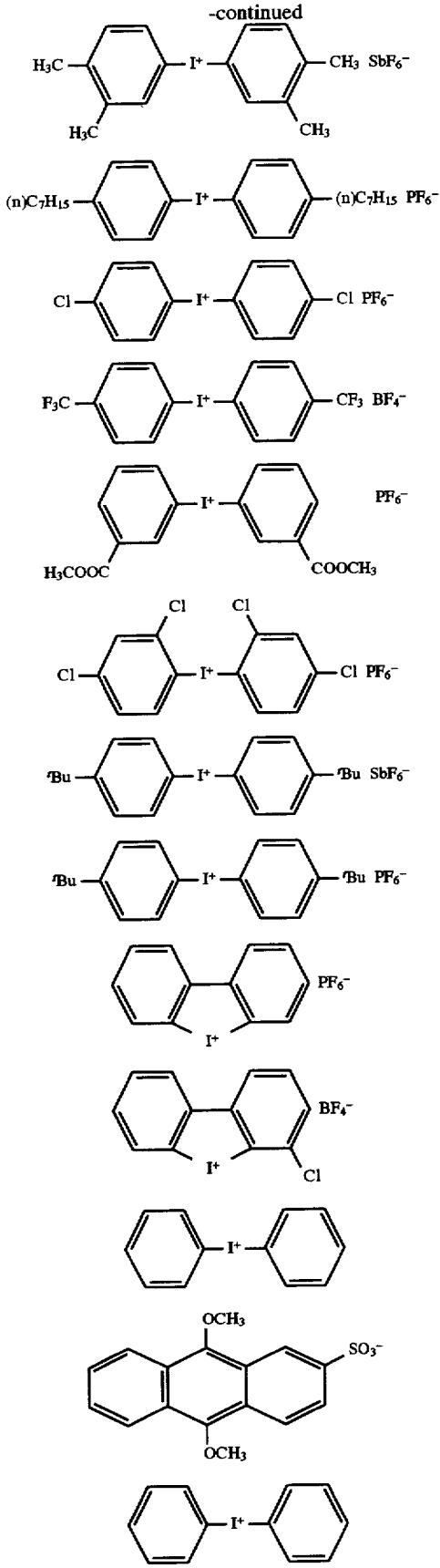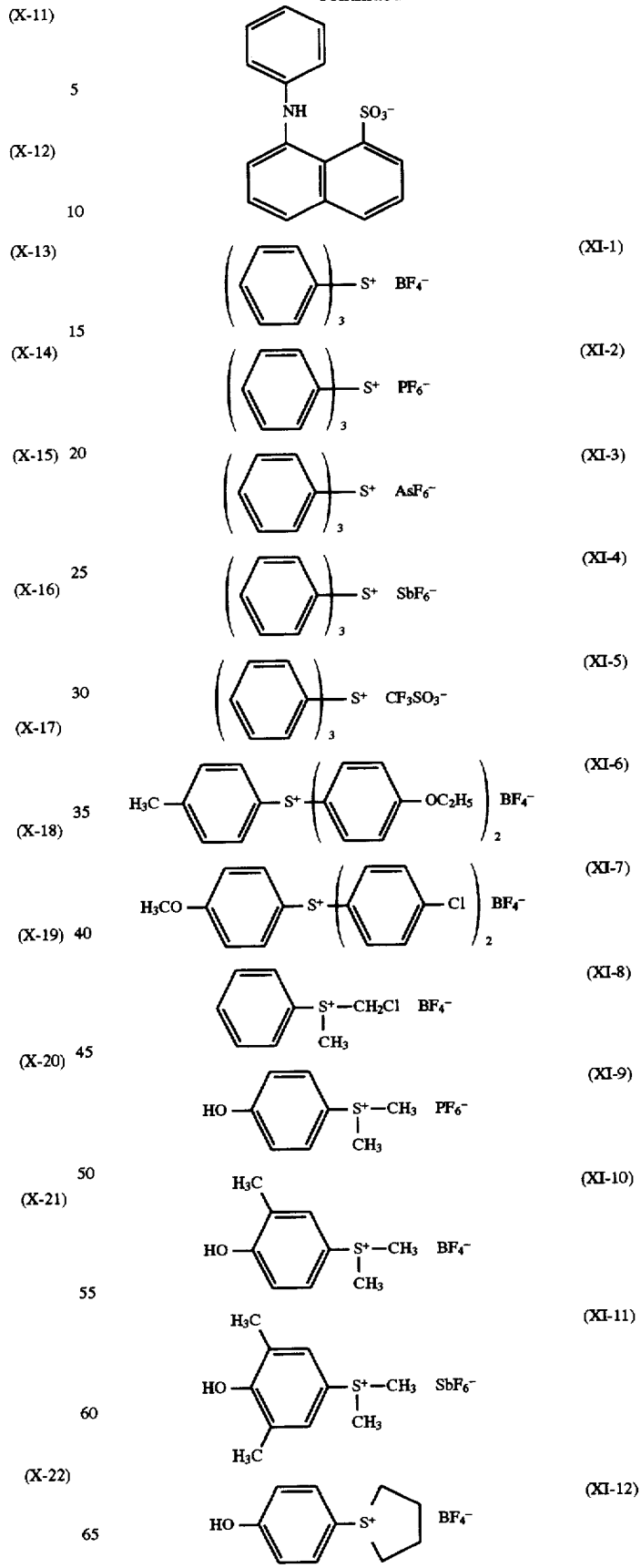

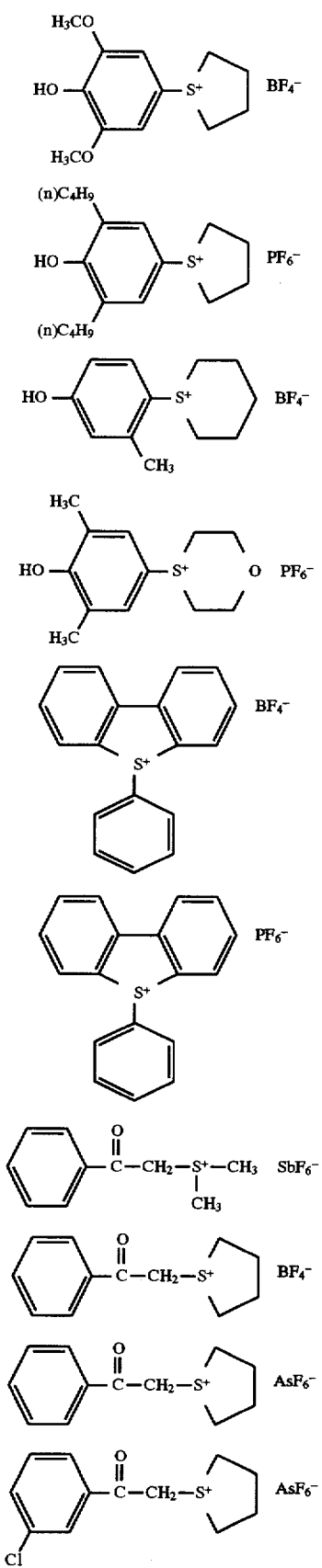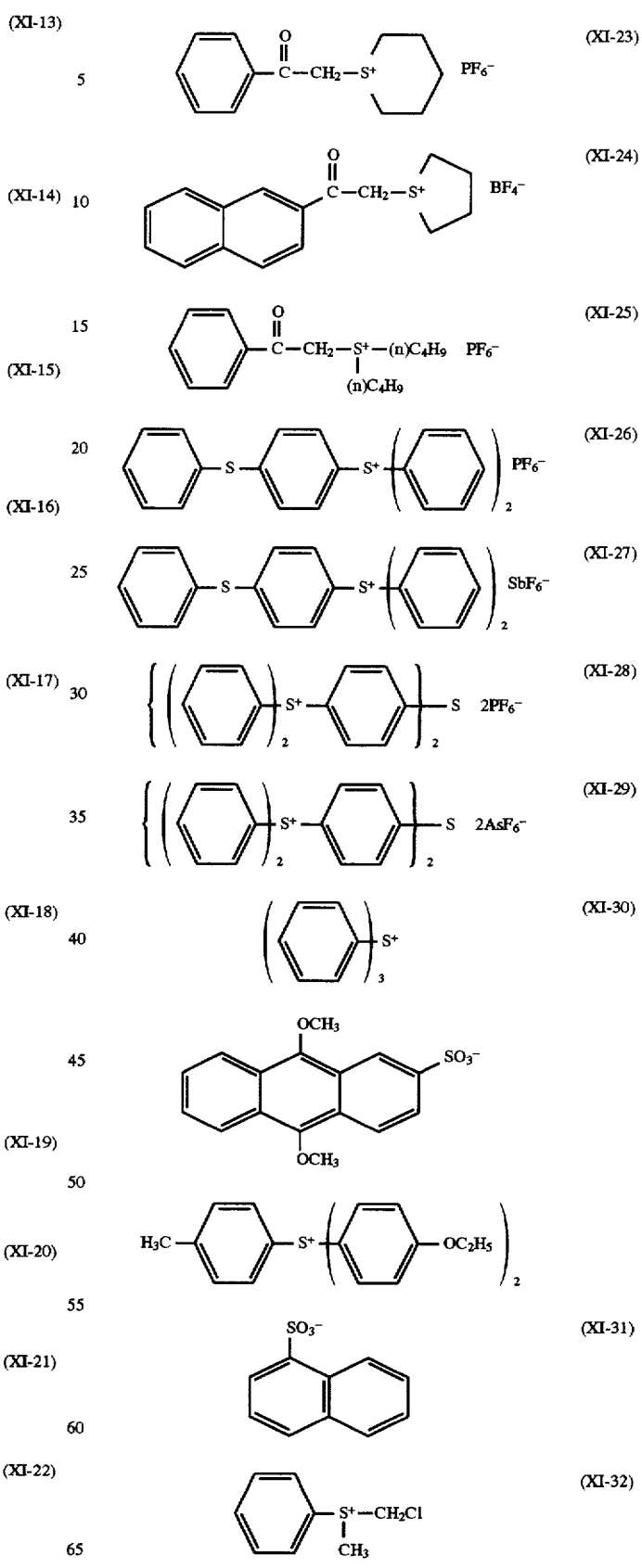

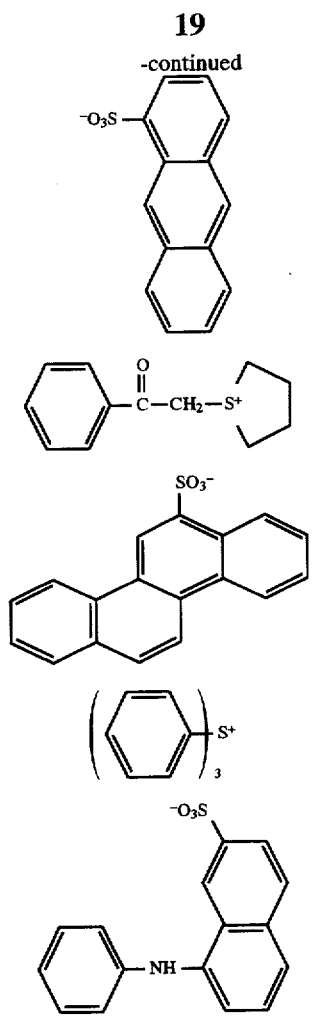

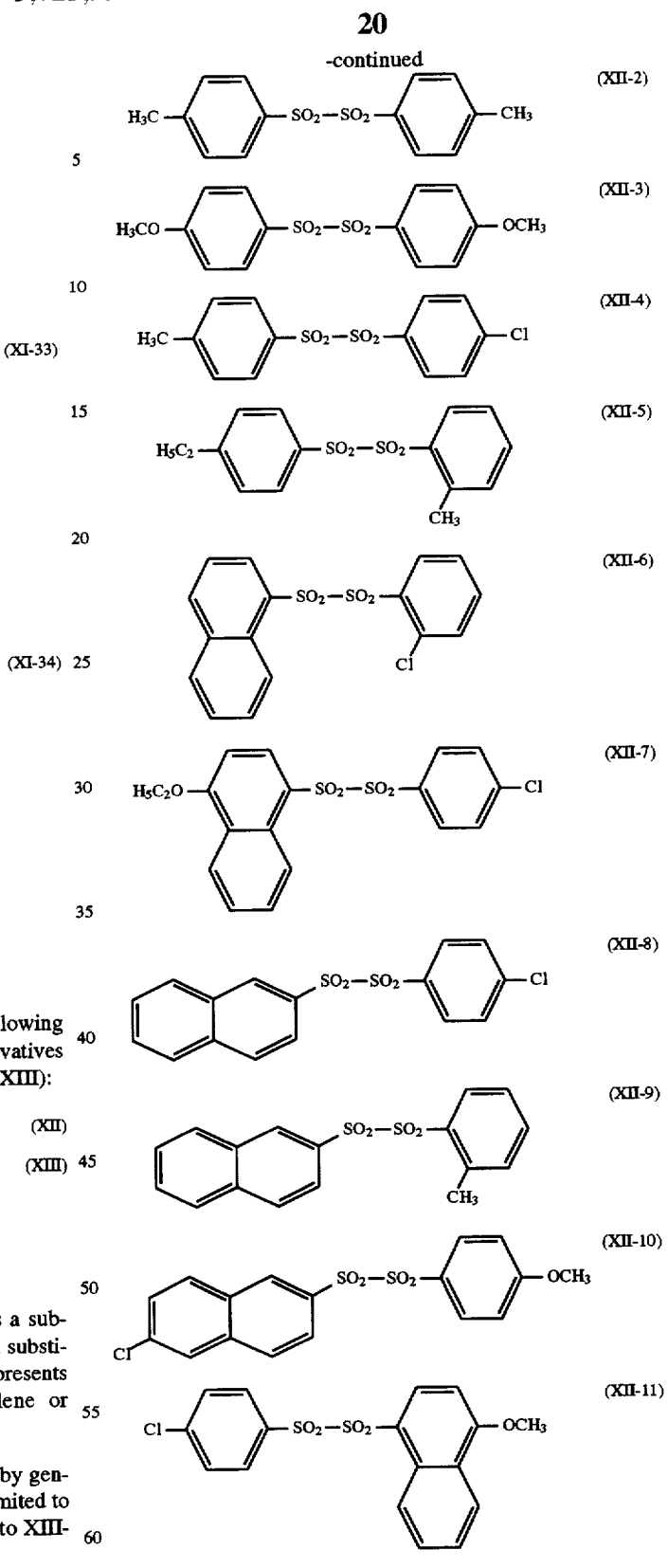

(3) Disulfone derivatives represented by the following general formula (XII) or iminosulfonate derivatives represented by the following general formula (XIII):

$$Ar^3-SO_2-SO_4-Ar^4 \quad (XII)$$

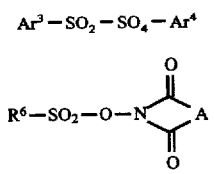

wherein $Ar^3$ and $Ar^4$ each independently represents a substituted or unsubstituted aryl group, $R^6$ represents a substituted or unsubstituted alkyl or aryl group, and A represents a substituted or unsubstituted alkylene, alkenylene or arylene group.

Specific examples of the compounds represented by general formulas (XII) and (XIII) include but are not limited to compounds XII-1 to XII-12 and compounds XIII-1 to XIII-12 shown below:

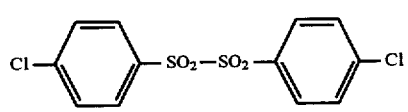

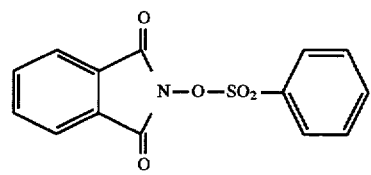 (XIII-1)

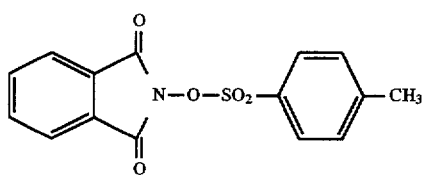 (XIII-2)

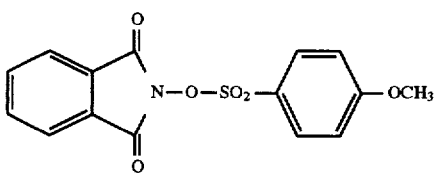 (XIII-3)

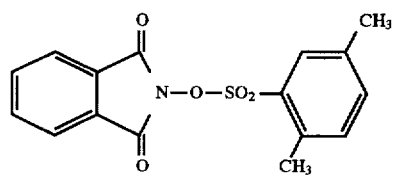 (XIII-4)

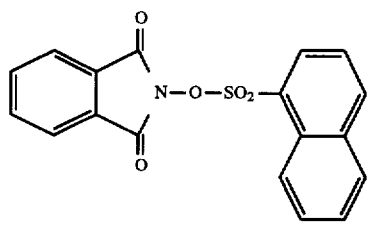 (XIII-5)

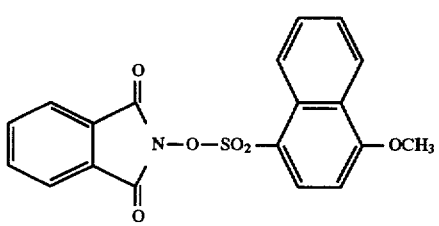 (XIII-6)

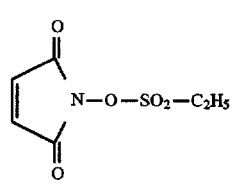 (XIII-7)

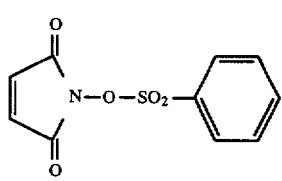 (XIII-8)

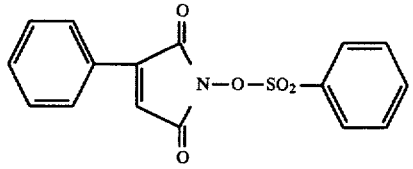 (XIII-9)

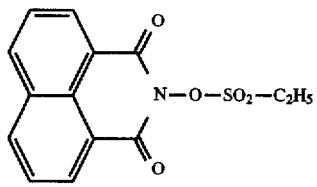 (XIII-10)

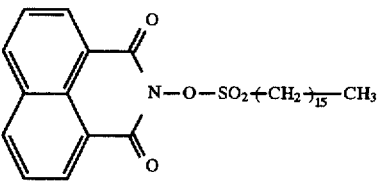 (XIII-11)

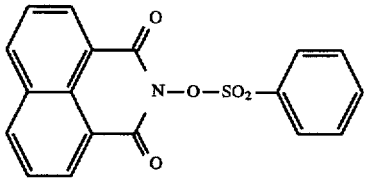 (XIII-12)

These compounds decomposed by irradiation of radiation to generate acids are added usually in an amount of 0.001 to 40% by weight based on total solids contained in the photosensitive composition, and preferably in an amount of 0.1 to 20% by weight.

As to the hydroxyl group-containing polymers used in the present invention, any polymers can be used as long as they thermally react with N-hydroxyimide compounds in the presence of acids and have chemical bonds.

Specific examples of the hydroxyl group-containing polymers used in the present invention include polymers described below.

(1) Copolymers of hydroxyl group-containing vinyl monomers and other copolymerizable vinyl monomers The hydroxyl group-containing monomers used in the present invention include but are not limited to butanediol monoacrylate, EHC-modified butyl acrylate, 3-chloro-2-hydroxypropyl methacrylate, glycerol methacrylate, glycerol acrylate, 2-hydroxyethyl acrylate, 2-hydroxyethyl methacrylate, 2-hydroxypropyl acrylate, 2-hydroxypropyl methacrylate, phenoxyhydroxypropyl acrylate, EO-modified phthalic acid acrylate, EO-, PO-modified phthalic acid methacrylate, polyethylene glycol methacrylate, polypropylene glycol methacrylate, p-2-hydroxyethylstyrene and m-hydroxystyrene.

The other monomers copolymerizable with the above-mentioned monomers include but are not limited to acrylic acid, methacrylic acid, maleic acid, itaconic acid, crotonic acid, isocrotonic acid, p-vinylbenzoic acid, p-vinylbenzenesulfonic acid, p-vinylcinnamic acid, maleic acid monomethyl ether, maleic acid monoethyl ether, acrylonitrile, acrylamide, methacrylamide, methyl acrylate, ethyl acrylate, propyl acrylate, butyl acrylate, benzyl acrylate, methyl methacrylate, ethyl methacrylate, benzyl methacrylate, vinyl benzoate, vinyl chloride, vinylidene chloride, styrene, vinyl acetate, N-(4-sulfamoylphenyl)

methacrylamide, N-phenylphosphonylmethacrylamide, butadiene, chloroprene and isoprene, 2-mercaptoethyl acrylate.

The hydroxyl group-containing vinyl monomers and the other copolymerizable monomers can be copolymerized in any combination and number. However, the weight ratio of the hydroxyl group-containing vinyl monomer(s) to the other copolymerizable monomer(s) is 0.5:99.5 to 90:10, preferably 1:99 to 70:30, and more preferably 3:97 to 40:60.

(2) Copolycondensation products of hydroxyl group-containing dicarboxylic acid compounds and diol compounds Examples of the copolycondensation products include but are not limited to copolycondensation products of dicarboxylic acids such as 2-hydroxyterephthalic acid, 3-ethylhydroxy-terephthalic acid and 2-hydroxypropyldicarboxylic acid, and diol compounds such as ethylene glycol, diethylene glycol, triethylene glycol, neopentyl glycol, 1,3-butylene glycol, bisphenol A, hydrogenated bisphenol A and hydrogenated bisphenol F.

Further, the above-mentioned polymers can be copolycondensed with other diols and/or dicarboxylic acids to obtain multicomponent linear polymers, if necessary.

The weight ratio of the hydroxyl group-containing dicarboxylic acid(s) to the other monomer(s) is 0.5:99.5 to 90:10, preferably 1:99 to 70:30, and more preferably 3:97 to 40:60.

(3) Various solvent-soluble resins such as epoxy resins and phenoxy resins (4) Resins containing phenolic hydroxyl groups Specific examples of these resins include but are not limited to novolak resins such as phenol-formaldehyde resins, m-cresol-formaldehyde resins, p-cresol-formaldehyde resins, o-cresol-formaldehyde resins, m-/p-mixed cresol-formaldehyde resins and phenol/cresol-formaldehyde resins, resol type phenol resins, phenol-modified xylene resins, polyhydroxystyrene resins, polyhydroxystyrene halides, acrylic resins having phenolic hydroxyl groups.

In the present invention, of these linear polymers, the polymers of (1) and (2) are preferred.

The weight-average molecular weight of these linear polymers is 1,000 to 1,000,000, preferably 1,500 to 200,000, and more preferably 2,000 to 100,000.

In the present invention, the linear polymers can be used either alone or as a combination of several kinds of them. The linear polymers are added to the photosensitive compositions usually in an amount of 1 to 95% by weight based on total solids contained in the photosensitive composition, preferably in an amount of 20 to 90% by weight, and more preferably in an amount of 30 to 80% by weight.

The radiation-absorbing substances which can be preferably used in the photosensitive compositions of the present invention are substances absorbing light (radiation) and generating heat. As such substances, various pigments and dyes are used.

The pigments which can be utilized in the present invention include commercially available dyes and dyes described in Color Index (C. I.) Binran (Handbook of Color Index), Saishin Ganryo Binran (The Newest Handbook of Pigments, edited by Nippon Ganryo Gijutsu Kyokai (1977), Saishin Ganryo Ohyo Gijutsu (The Newest Application Techniques of Pigments, CMC Shuppan (1986) and Insatsu Ink Gijutsu (Techniques of Printing Ink), CMC Shuppan (1984).

The pigments include black pigments, yellow pigments, orange pigments, brown pigments, red pigments, purple pigments, blue pigments, green pigments, fluorescent pigments and other polymer binding dyes. Specifically, there can be used insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black.

These pigments may be used without surface treatment or subjected to surface treatment for use. As methods for surface treatment, there are conceivable methods of coating surfaces of pigments with resins or wax, methods of adhering surface active agents to surfaces of pigments and methods of binding reactive substances (for example, silane coupling agents, epoxy compounds and polyisocyanates) to surfaces of pigments. The above-mentioned surface treating methods are described in Kinzoku Sekken no Seishitsu to Ohyo(Properties and Application of Metallic Soap), Sachi Shobo, Insatsu Ink Gijutsu (Techniques of Printing Ink), CMC Shuppan (1984) and Saishin Ganryo Ohyo Gijutsu (The Newest Application Techniques of Pigments, CMC Shuppan (1986).

The particle size of the pigments is preferably within the range of 0.01 µm to 10 µm, and more preferably within the range of 0.05 µm to 1 µm. The pigments can be dispersed by known dispersing techniques used in ink production, toner production, etc. Dispersing devices for dispersing the pigments include ultrasonic dispersers, sand mills, attriters, pearl mills, super mills, ball mills, impellers, dispersers, KD mills, colloid mills, dynatrons, 3-roll mills and pressure kneaders. The details thereof are described in Saishin Ganryo Ohyo Gijutsu (The Newest Application Techniques of Pigments, CMC Shuppan (1986).

As the dyes, commercially available dyes and known dyes described in literatures (for example, Senryo Binran (Handbook of Dyes), edited by Yuki Gosei Kagaku Kyokai (1970)) can be utilized. Specific examples thereof include azo dyes, metal complex azo dyes, pyrazolone azo dyes, anthraquinone dyes, phthalocyanine dyes, carbonium dyes, quinoneimine dyes, methine dyes and cyanine dyes.

Of these pigments and dyes, ones absorbing infrared light or near infrared light are particularly preferred.

Preferred examples of the pigments absorbing infrared light or near infrared light include carbon black.

The dyes absorbing infrared light or near infrared light include, for example, cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52490 and JP-A-60-63744, squarylium dyes described in JP-A-58-112792 and cyanine dyes described in British Patent 434,875.

Further, near infrared absorbing agents described in U.S. Pat. No. 5,156,938 are also preferably used.

Furthermore, the compounds particularly preferably used include substituted arylbenzo(thio)pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethio-pyrylium salts described in U.S. Pat. No. 4,283,475 and pyrylium compounds described in JP-B-5-13514 and JP-B-5-19702.

Particularly preferred other examples thereof include near infrared absorbing agents represented by formulas (I) and (II) in U.S. Pat. No. 4,756,993.

These pigments or dyes are added to the photosensitive compositions in an amount of 0.01 to 50% by weight based on total solids contained in the photosensitive composition, preferably in an amount of 0.1 to 20% by weight, and more preferably in an amount of 0.5 to 15% by weight. If the amount added is less than 0.01% by weight, no image is obtained. On the other hand, exceeding 50% by weight results in development of scums on non-image areas in printing.

The photosensitive compositions of the present invention can be applied to supports, using solvents in which the above-mentioned respective components are dissolved or dispersed. When used for resist materials of semiconductors, etc., they can be used as they are dissolved in the solvents. The solvents used herein include methanol, ethanol, propanol, isopropyl alcohol, n-butyl alcohol, t-butyl alcohol, ethylene dichloride, cyclohexanone, acetone, methyl ethyl ketone, ethylene glycol, ethylene glycol monomethyl ether, ethylene glycol monoethyl ether, 2-methoxy-ethyl acetate, 1-methoxy-2-propanol, 1-methoxy-2-propyl acetate, N,N-dimethylformamide, tetrahydrofuran, dioxane, dimethyl sulfoxide, ethyl acetate, methyl lactate, ethyl lactate, γ-butyrolactone, dimethoxyethane, tetramethylurea, N,N-dimethylacetamide, N-methylpyrrolidone, sulfolane and toluene. These solvents are used alone or as mixtures.

Further, mixed solvents of these solvents or mixed solvents with a small amount of water or solvents such as toluene which do not dissolve the diazo resins or the polymers are suitable.

The concentration of the above-mentioned components (total solids including additives) contained in the solvents is preferably 2 to 50% by weight, more preferably 3 to 30% by weight, and most preferably 5 to 20% by weight.

When the compositions are used by coating, the coating weight varies depending on their application. For example, for photosensitive lithographic printing plates, the coating weight is generally 0.5 to 3.0 $g/m^2$ as solids, preferably 0.8 to 2.5 $g/m^2$, and more preferably 1.0 to 2.0 $g/m^2$. For photoresists, the coating weight is generally 0.1 to 3.0 $g/m^2$ as solids, preferably 0.2 to 2.0 $g/m^2$, and more preferably 0.3 to 1.5 $g/m^2$. The sensitivity increases with an decrease in the coating weight, but the coating characteristics of photosensitive coatings deteriorate.

The solutions or dispersions of the components in these solvents are applied and dried to form coatings. When the negative type photosensitive compositions are prepared, drying is preferably performed at 50° to 100° C.

Further, alkyl ethers (for example, ethyl cellulose and methyl cellulose) and surface active agents (for example, fluorine surface active agents) for improving coating properties, and plasticizers for imparting flexibility and wear resistance to coatings (for example, tricresyl phosphate, dimethyl phthalate, dibutyl phthalate, trioctyl phosphate, tributyl phosphate, tributyl citrate, polyethylene glycol and polypropylene glycol) can be added thereto. The amount of these additives added is generally 0.5 to 30% by weight based on total solids contained in the photosensitive composition, although it varies depending on their purpose.

Furthermore, as printing-out agents for obtaining visible images immediately after absorption of radiation, combinations of compounds releasing acids by heat due to exposure and organic dyes which can form salts are typically used. Specific examples thereof include combinations of o-naphthoquinone-diazido-4-sulfonic acid halogenides and salt-forming organic dyes described in JP-A-50-36209 and JP-A-53-8128, and combinations of trihalomethyl compounds and salt-forming organic dyes described in JP-A-53-36223 and JP-A-54-74728. Dyes other than the above-mentioned salt-forming organic dyes can also be used as coloring agents for images. Including the salt-forming organic dyes, oil-soluble dyes and basic dyes can be suitably used. Specific examples thereof include Oil Yellow #101, Oil Yellow #130, Oil Pink #312, Oil Green BG, Oil Blue BOS, Oil Blue #603, Oil Black BY, Oil Black BS and Oil Black T-505 (manufactured by Orient Kagaku Kogyo K. K.), Victoria Pure Blue, Crystal Violet (CI 42555), Methyl Violet (CI 42535), Rhodamine B (CI 45170B), Malachite Green (CI 42000) and Methylene Blue (CI 52015). These dyes are added to the photosensitive compositions in an amount of 0.01 to 10% by weight based on total solids contained in the photosensitive composition, and preferably in an amount of 0.1 to 3% by weight.

In addition, cyclic acid anhydrides and other fillers can be added as compounds for adjusting the solubility of the negative type photosensitive compositions in aqueous alkali solutions in the present invention.

The cyclic acid anhydrides include phthalic anhydride, tetrahydrophthalic anhydride, hexahydrophthalic anhydride, 3,6-endoxytetrahydrophthalic anhydride, tetrachlorophthalic anhydride, maleic anhydride, chloromaleic anhydride, α-phenyl-maleic anhydride, succinic anhydride and pyromellitic acid as described in U.S. Pat. No. 4,115,128. These cyclic acid anhydrides can be added preferably in an amount of 1 to 15% by weight based on total solids contained in the photosensitive composition, more preferably in an amount of 2 to 15% by weight, and most preferably in an amount of 3 to 10% by weight, thereby causing a maximum increase of about 3 times in sensitivity.

In the present invention, when the radiation-absorbing substances are used, formation of visible images having sufficient density makes it unnecessary to add such dyes.

The coating weight of the photosensitive compositions varies depending on their application. For example, for photosensitive lithographic printing plates (heat-sensitive lithographic printing plates), the coating weight is preferably 0.5 to 3.0 $g/m^s$ as solids. The sensitivity increases with an decrease in the coating weight, but the properties of photosensitive coatings deteriorate. Mats or matte layers may be further provided on the photosensitive coatings as required.

Examples of the supports coated with the photosensitive compositions of the present invention include paper, paper laminated with plastics (such as polyethylene, polypropylene and polystyrene), plates of metals such as aluminum (including aluminum alloys), zinc and copper, films of plastics such as cellulose diacetate, cellulose triacetate, cellulose propionate, cellulose acetate, cellulose butyrate acetate, cellulose butyrate, polyethylene terephthalate, polyethylene, polystyrene, polypropylene, polycarbonates and polyvinyl acetal, and paper or plastic films laminated or deposited with metals as described above. Of these supports, the polyester film or the aluminum plate is preferably used. In particular, the aluminum plate is preferred because of its high dimensional stability. Further, a composite sheet comprising a polyethylene terephthalate film and an aluminum sheet bonded thereto as described in JP-B-48-18327 is also preferred. In the case of a support having a surface of a metal, particularly aluminum, the surface is preferably subjected to appropriate hydrophilic treatment.

As such hydrophilic treatment, it is preferred that the aluminum surface is grained by mechanical processes such as wire brush graining, brush graining of roughening the surface with a nylon brush while pouring a slurry of abrasive particles and ball graining, chemical graining of using HF, $AlCl_3$ or HCl as an etchant, electrolytic graining of using nitric acid or hydrochloric acid as an electrolytic solution, or complex graining of roughening the surface by a combination of the above-mentioned graining processes, then, etched with an acid or an alkali if necessary, and subsequently, subjected to anode oxidation in sulfuric acid, phosphoric acid, oxalic acid, boric acid, chromic acid, sulfamic acid or a mixed acid thereof with a direct current or alternate current source, thereby forming a solid passive coating on the aluminum surface. Although the aluminum surface is hydrophilized by the passive coating itself, the hydrophilicity is more improved by silicate (sodium silicate or potassium silicate) treatment described in U.S. Pat. Nos. 2,714,066 and 3,181,461, potassium fluorozirconate treatment described in U.S. Pat. No. 2,946,638, phosphomolybdate treatment described in U.S. Pat. No. 3,201,247, alkyl titanate treatment described in British Patent 1,108,559, polyacrylic acid treatment described in German Patent 1,091,433, polyvinylphosphonic acid treatment described in German Patent 1,134,093 and British Patent 1,230,447, phosphonic acid treatment described in JP-B-44-6409, phytic acid treatment described in U.S. Pat. No. 3,307,951, complex treatment using a hydrophilic organic polymer and a divalent metal described in JP-A-58-16893 and JP-A-58-18291, or a undercoating of a sulfonic acid group-containing water-soluble polymer described in JP-A-59-101651, which are further applied to the passive coating. Other hydrophilic treatment processes include silicate electrochemical deposition described in U.S. Pat. No. 3,658,662.

The negative type photosensitive compositions of the present invention are applied to the above-mentioned supports by known coating techniques. Examples of the coating techniques include rotary coating, wire bar coating, dip coating, air knife coating, roll coating, blade coating, curtain coating and spray coating.

The layers of the negative type photosensitive compositions applied as described above are dried by use of a hot air dryer, an infrared dryer or the like at a temperature of 40° to 150° C for 30 seconds to 10 minutes.

When the negative type photosensitive compositions of the present invention are used as photoresists, substrates of various materials such as copper plates, copper-plated plates, silicon plates, stainless steel plates and glass plates can be used as the supports.

Photosensitive lithographic printing plates or photoresists containing the negative type photosensitive compositions of the present invention are subjected to image exposure, and further to heat treatment and development if necessary.

Examples of light sources of active beams used for image exposure include mercury lamps, metal halide lamps, xenon lamps, chemical lamps and carbon arc lamps. Radiations include electron beams, X-rays, ion beams and far infrared rays. Further, g-rays, i-rays, deep-UV light and high-density energy beams (laser beams) are also used. The laser beams include helium-neon laser beams, argon laser beams, krypton laser beams, helium-cadmium laser beams and KrF excimer laser beams. In the present invention, light sources having an emission region from near infrared to infrared are preferred, and solid lasers and semiconductor lasers are particularly preferred.

In the method of producing the image recording material of the present invention, heating treatment after exposure can be performed at 50° to 250° C. for 1 second to 30 minutes, preferably at 70° to 200° C. for 5 seconds to 5 minutes.

As developing solutions and replenishers for the photosensitive compositions of the present invention, previously known aqueous alkali solutions can be used. Examples of the alkalis include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. There can also be used organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents are used either alone or as a combination of two or more of them. They are added to give a concentration of 0.1 to 10% by weight, preferably 0.5 to 5% by weight.

In order to enhance or inhibit developing properties, disperse development scum and enhance ink-receptivity of image areas of printing plates, various surface active agents and organic solvents can be added to the developing solutions and the replenishers as required. Preferred examples of the surface active agents include anionic, cationic, nonionic and amphoteric surface active agents.

Further, reducing agents such as hydroquinone, resorcin, and sodium salts and potassium salts of inorganic acids such as sulfurous acid and hydrogensulfite, organic carboxylic acids, anti-foam fluid and hard water softeners can be added to the developing solutions and the replenishers as required.

Particularly preferred examples of these developing solutions include developing solutions described in JP-A-54-62004 and JP-B-57-7427, developing solution compositions comprising benzyl alcohol, anionic surface active agents and alkali agents described in JP-A-51-77401, developing solution compositions comprising aqueous solutions containing benzyl alcohol, anionic surface active agents and water-soluble sulfites described in JP-A-53-44202, and developing solution compositions comprising organic solvents having a solubility in water of 10% by weight or less at ordinary temperature, alkali agents and water described in JP-A-55-155355.

When the photosensitive compositions of the present invention are used as the printing plates, they are preferably post-treated with washing water, rinsing solutions containing surface active agents, etc. and desensitizing solutions containing gum arabic and starch derivatives, after development by use of the above-mentioned developing solutions and replenishers. These solutions can be variously combined for post-treatment.

Recently, in plate-making and printing industries, automatic processors have been widely used for rationalization and standardization of plate-making operations. The automatic processor generally comprises a developing unit and a post-treatment unit, each of which has a device for transferring a printing plate, each processing solution tank and spray means. Each processing solution pumped is sprayed on the exposed printing plate from the spray nozzle while transferring the plate to conduct development processing. Recently, a method has also been known in which a printing plate is immersed and transferred in a processing solution tank filled with a processing solution, by means of guide rolls mounted in the tank, thereby processing the plate.

Such automatic processing can be conducted while replenishing a replenisher to each processing solution according to the amount of processing, the operating time, etc.

In addition, a so-called disposable processing system can be applied in which processing is performed with a substantially unused processing solution.

When the lithographic printing plates obtained by image exposing, developing, washing and/or rinsing and/or gumming the photosensitive lithographic printing plates using the photosensitive compositions of the present invention have unnecessary image areas (for example, film edge marks of original films), the unnecessary areas are deleted. Such deletion is performed, for example, by applying a deletion fluid to the unnecessary area, and allowing it to stand for a specified period of time, followed by washing, as described in JP-B-2-13293.

The lithographic printing plates thus obtained can be subjected to the printing stage after coating of desensitizing gum as so desired.

The present invention will be illustrated in more detail with reference to examples below, but these are not to be construed as limiting the invention.

EXAMPLES 1 TO 10 AND COMPARATIVE EXAMPLES 1 TO 3

A 0.24-mm thick is aluminum plate was immersed in a 10% aqueous solution of sodium tertiary phosphate kept at 80° C. for 3 minutes to degrease it. After graining with a nylon brush, the plate was etched with sodium aluminate for about 10 minutes, and subjected to desmutting treatment using a 3% aqueous solution of sodium hydrogensulfate. The resulting aluminum plate was subjected to anode oxidation in 20% sulfuric acid at a current density of 2 A/dm$^2$ for 2 minutes.

Using various compounds shown in Table 1 given below, 13 kinds of photosensitive solutions [A]-1 to [A]-10 and [A']-3 to [A']-3 were prepared as the following formulations. Each of the photosensitive solutions was applied to the above-mentioned aluminum plate subjected to anode oxidation, and dried at 100° C. for 10 minutes to prepare each photosensitive lithographic printing plate. In this case, the coating weights were all adjusted to 1.7 g/m$^2$ on a dry weight basis.

| Photosensitive Solution Formulation [A] | |
|---|---|
| Linear Polymer of Table 1 | 2.0 g |
| Hydroxyimide Compound of Table 1 | 0.5 g |
| Acid Precursor of Table 1 | 0.2 g |
| Victoria Pure Blue BOH (Dye manufactured by Hodogaya Chemical Co., Ltd.) | 0.1 g |
| 1-Methoxy-2-propyl Acetate | 20.0 g |
| Methyl Ethyl Ketone | 40.0 g |

Then, a grey scale having a difference in density of 0.15 was adhered to a photosensitive layer of the resulting photosensitive lithographic printing plate, and exposed to light of a 2-kW high pressure mercury lamp 50 cm apart for 20 seconds. The photosensitive lithographic printing plate exposed was heated at 120° C. for 5 minutes, and thereafter, immersed in a 2-fold diluted aqueous solution of the following developing stock solution [Y] at 25° C. for 60 seconds to conduct development.

| Developinq Stock Solution [Y] | |
|---|---|
| Water | 80 g |
| Triethanolamine | 3 g |
| Sodium t-Butylnaphthalenesulfonate | 8 g |
| Benzyl Alcohol | 9 g |

The sharpness of the resulting image was visually evaluated. Further, in order to indicate the sensitivity, to what density of the gray scale the sharp image was obtained was indicated by the grade number of the grey scale. The more grade number of the grey scale indicates the higher sensitivity. Results thereof are shown in Table 1

TABLE 1

| Example No. | Photosensitive Solution | Polymer | Hydroxyimide Compound | Acid Precursor | Image (G/S Grade Number) |
|---|---|---|---|---|---|
| Example 1 | [A]-1 | Methacrylic Acid/Benzyl Methacrylate/2-Hydroxyethyl Methacrylate = 20/60/20 (wt %), Mw = 37,000 | I-18 | X-22 | Sharp negative image (7) |
| Example 2 | [A]-2 | Methacrylic Acid/Benzyl Methacrylate/2-Hydroxyethyl Methacrylate = 20/60/20 (wt %), Mw = 37,000 | I-14 | X-22 | Sharp negative image (8) |
| Example 3 | [A]-3 | Methacrylic Acid/Benzyl Methacrylate/2-Hydroxyethyl Methacrylate = 20/60/20 (wt %), Mw = 37,000 | I-16 | X-22 | Sharp negative image (7) |
| Example 4 | [A]-4 | Methacrylic Acid/Benzyl Methacrylate/2-Hydroxyethyl Methacrylate = 20/60/20 (wt %), Mw = 37,000 | I-19 | X-22 | Sharp negative image (8) |
| Example 5 | [A]-5 | Methacrylic Acid/Benzyl Methacrylate/2-Hydroxyethyl Methacrylate = 20/60/20 (wt %), Mw = 37,000 | I-18 | XII-11 | Sharp negative image (5) |
| Example 6 | [A]-6 | Methacrylic Acid/Benzyl Methacrylate/2-Hydroxyethyl Methacrylate = 20/60/20 (wt %), Mw = 37,000 | I-18 | IX-2 | Sharp negative image (6) |
| Example 7 | [A]-7 | Methacrylic Acid/Benzyl Methacrylate/2-Hydroxyethyl Methacrylate = 20/60/20 (wt %), | I-18 | XIII-12 | Sharp negative image (5) |

TABLE 1-continued

| Example No. | Photosensitive Solution | Polymer | Hydroxyimide Compound | Acid Precursor | Image (G/S Grade Number) |
|---|---|---|---|---|---|
| Example 8 | [A]-8 | Methacrylic Acid/Benzyl Methacrylate/Glycerol Methacrylate = 20/60/20 (wt %), Mw = 37,000 | I-18 | X-22 | Sharp negative image (8) |
| Example 9 | [A]-9 | Methacrylic Acid/Benzyl Methacrylate/2-Hydroxypropyl Acrylate = 20/60/20 (wt %), Mw = 30,000 | I-18 | X-22 | Sharp negative image (8) |
| Example 10 | [A]-10 | Acrylic Acid/Methyl Methacrylate/2-Hydroxyethyl Acrylate = 10/60/30 (wt %), Mw = 32,000 | I-18 | X-22 | Sharp negative image (7) |
| Comparative Example 1 | [A']-1 | Methacrylic Acid/Benzyl Methacrylate/2-Hydroxyethyl Methacrylate = 20/60/20 (wt %), Mw = 30,000 | Not added | X-22 | No image was formed |
| Comparative Example 2 | [A']-2 | Methacrylic Acid/Benzyl Methacrylate/2-Hydroxyethyl Methacrylate = 20/60/20 (wt %), Mw = 37,000 | I-18 | Not added | " |
| Comparative Example 3 | [A']-3 | Methacrylic Acid/Benzyl Methacrylate = 20/80 (wt %), Mw =0 35,000 | I-18 | X-22 | " |

The results shown in Table 1 reveals that all the photosensitive compositions of the present invention (Examples 1 to 10) gave sharp images. In contrast, no image was formed in all the composition containing no hydroxyimide compound (Comparative Example 1), the composition containing no acid precursor (Comparative Example 2) and the composition in which the polymer having no hydroxyl group was used (Comparative Example 3).

EXAMPLE 11

[Preparation of Substrate]

A substrate was prepared by the method described in JP-A-56-28893. That is, a surface of a 0.24-mm thick aluminum plate was grained by use of a nylon brush and an aqueous suspension of 400-mesh pumice stone, followed by sufficient washing with water. Then, the resulting aluminum plate was immersed in a 10% aqueous solution of sodium hydroxide at 70° C. for 60 seconds to etch it, and thereafter, washed with running water. Then, the plate was further subjected to neutralization washing using 20% $HNO_3$, followed by washing. Then, this plate was subjected to electrolytic surface-roughening treatment in a 1% aqueous solution of nitric acid by use of sinusoidal alternating waveform current at an anode time voltage of 12.7 V at a cathode time quantity of electricity to anode time quantity of electricity ratio of 0.8 at an anode time quantity of electricity of 160 coulombs/$dm^2$. At this time, the surface roughness was measured. As a result, the surface roughness was 0.6 μm (Ra indication). Subsequently, the plate was immersed in 30% sulfuric acid, and desmutted at 55° C. for 2 minutes. Thereafter, the plate was subjected to anodic oxidation treatment in 20% sulfuric acid at a current density of 2 A/$dm^2$ for 2 minutes to give a coating weight of 2.7 g/$m^2$. Then, the plate was immersed in a 2.5% aqueous solution of sodium silicate at 70° C. for 1 minute, followed by washing and drying.

[Preparation of Carbon Black Dispersion]

The following composition was dispersed with glass beads for 10 minutes to obtain a carbon black dispersion.

| | |
|---|---|
| Carbon Black | 1 part by weight |
| Copolymer of Benzyl Methacrylate and Methacrylic Acid (molar ratio = 72:28, weight average molecular weight = 70,000) | 1.6 parts by weight |
| Cyclohexanone | 1.6 parts by weight |
| Methoxypropyl Acetate | 3.8 parts by weight |

[Preparation of Negative Type Photosensitive Lithographic Printing Plate]

The following photosensitive solution was applied to the aluminum plate obtained above, and dried at 80° C. for 2 minutes to obtain a negative type photosensitive lithographic printing plate. The weight after drying was 2.0 g/$m^2$. Photosensitive Solution

| | |
|---|---|
| Carbon Black Dispersion Described Above | 10 g |
| Compound I-18 | 2 g |
| Compound X-22 | 0.3 g |
| Benzyl Methacrylate/Methacrylic Acid/2-Hydroxyethyl Methacrylate Copolymer (molar ratio = 60/20/20, weight average molecular weight = 38,000 | 10 g |
| FC-430 (Fluorine Surface Active Agent Manufactured by 3 M Co. (U.S.A.) | 0.1 g |
| Methyl Ethyl Ketone | 50 g |

The resulting negative type photosensitive lithographic printing plate was exposed with an YAG laser controlled to a printing plate output of 2 W. Then, the plate was processed through an automatic processor in which developing solution DN-3C (1:1) manufactured by Fuji Photo Film Co., Ltd. and gum fluid FN-2 (1:1) were charged. As a result, a negative image was obtained. This lithographic printing plate was printed with a Hidelberger SOR-KZ printer (manufactured by Hidelberger Druckmaschinen Aktiengesellschaft). As a result, about 30,000 good prints were obtained.

EXAMPLES 12 TO 14

Samples were prepared in the same manner as with Example 11 with the exception that compounds shown in Table 2 were used in place of 2 g of compound I-18 in the photosensitive solution composition of Example 11, and similarly written with an YAG laser and developed. As a result, negative images were obtained. Using these printing plates, printing was performed in the same manner as with Example 11. As a result, good prints shown in Table 2 were obtained.

TABLE 2

| Example | Hydroxyimide Compound | Number of Prints |
|---|---|---|
| 12 | I-5 | about 30,000 |
| 13 | I-14 | about 35,000 |
| 14 | I-19 | about 30,000 |

EXAMPLES 15 TO 17

Samples were prepared in the same manner as with Example 11 with the exception that compounds shown in Table 3 were used in place of 0.3 g of compound X-22 in the photosensitive solution composition of Example 11, and similarly written with an YAG laser and developed. As a result, negative images were obtained. Using these printing plates, printing was performed in the same manner as with Example 11. As a result, good prints shown in Table 3 were obtained.

TABLE 3

| Example | Acid Precursor | | Number of Prints |
|---|---|---|---|
| 15 | IX-2 | 0.5 g | about 30,000 |
| 16 | XII-7 | 0.3 g | about 40,000 |
| 17 | XIII-2 | 0.3 g | about 35,000 |

EXAMPLE 18

A negative type photosensitive lithographic printing plate was prepared in the same manner as with Example 11 with the exception that the following resin was used in place of the linear polymer in the photosensitive solution composition of Example 11.

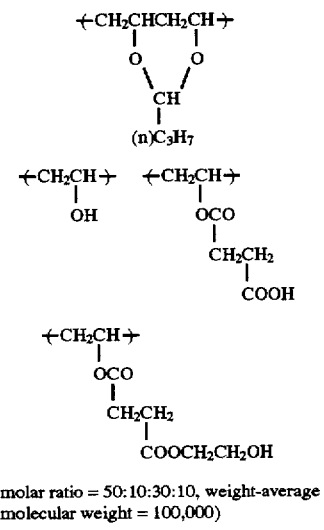

(molar ratio = 50:10:30:10, weight-average molecular weight = 100,000)

The resulting negative type photosensitive lithographic printing plate was exposed with an YAG laser controlled to a printing plate output of 2 W. Then, the plate was processed through an automatic processor in which developing solution DN-3C (1:1) manufactured by Fuji Photo Film Co., Ltd. and gum fluid FN-2 (1:1) were placed. As a result, a negative image was obtained. This lithographic printing plate was printed with a Hidelberger SOR-KZ printer. As a result, about 50,000 good prints were obtained.

EXAMPLE 19

A negative type photosensitive lithographic printing plate was prepared in the same manner as with Example 11 with the exception that the following dye was used in place of the carbon black dispersion used in Example 11.

Dye:

2, 6-Di-t-butyl-4-{5-(2, 6-di-t-butyl-4H-thio-
pyrane-4-ylidene)-penta-1, 3-dienyl}thiopyrylium
Tetrafluoroborate          0.02 g
(the compound described in U.S. Pat. No. 4,283,475

The resulting negative type photosensitive lithographic printing plate was exposed by use of a semiconductor laser (wavelength: 825 nm, spot diameter: $1/e^2=11.9$ µm) adjusted to a linear velocity of 8 m/second and a printing plate output of 110 mW. Then, development processing was performed in the same manner as with Example 11. As a result, a thin line having a width of 10 µm was formed.

Subsequently, the plate was subjected to 200-lpi halftone dot image exposure at a write resolution of 4000 dpi, followed by similar processing to form a halftone dot image. Using the resulting lithographic printing plate, printing on woodfree paper was conducted with an SOR-KZ printer manufactured by Heidelberg Co. and commercially available ink. As a result, excellent printing properties were obtained as with Example 11.

According to the present invention, there can be provided the novel photosensitive compositions which can produce sharp negative images, and further, the novel photosensitive compositions recordable independently of the emission wavelengths of exposure light sources, particularly recordable in a region from near infrared to infrared (heat rays). Further, the novel methods for producing the image recording materials which can form sharp images can be provided. Furthermore, there can be obtained the heat mode write type lithographic printing plates for direct plate-making which can directly record digital data of computers, etc. by use of solid state lasers and semiconductor lasers (heat mode) having an emission region from near infrared to infrared, and can utilize conventional processing devices or printing devices as they are.

While the invention has been described in detail and with reference to specific embodiments thereof, it will be apparent to one skilled in the art that various changes and modifications can be made therein without departing from the spirit and scope thereof.

What is claimed is:

1. A negative working photosensitive composition comprising an acid precursor, a compound represented by the following general formula (I) and a hydroxyl group-containing linear polymer:

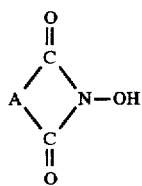
(I)

wherein A represents a divalent substituted or unsubstituted aliphatic residue, or a divalent substituted or unsubstituted aromatic residue.

2. The composition as claimed in claim 1, wherein said composition further comprises a radiation-absorbing substance.

3. The composition as claimed in claim 1, wherein said compound represented by the general formula (I) is added in an amount of 0.1 to 50% by weight based on total solids contained in the photosensitive composition.

4. The composition as claimed in claim 1, wherein said acid precursor is added in an amount of 0.001 to 40% by weight based on total solids contained in the photosensitive composition.

5. The composition as claimed in claim 1, wherein said hydroxy group-containing linear polymer has a weight-average molecular weight of from 1,000 to 1,000,000.

6. The composition as claimed in claim 1, wherein said hydroxy group-containing linear polymer is added in an amount of 1 to 95% by weight based on total solids contained in the photosensitive composition.

7. A method for producing an image recording material comprising the steps of subjecting a negative working photosensitive composition to image exposure, followed by heat treatment and further development, said composition comprising an acid precursor, a compound represented by the following general formula (I) and a hydroxyl group-containing linear polymer:

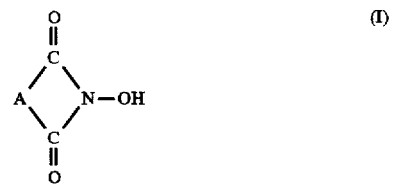

wherein A represents a divalent substituted or unsubstituted aliphatic residue, or a divalent substituted or unsubstituted aromatic residue.

* * * * *